United States Patent
Mauder et al.

(10) Patent No.: US 7,781,294 B2
(45) Date of Patent: Aug. 24, 2010

(54) METHOD FOR PRODUCING AN INTEGRATED CIRCUIT INCLUDING A SEMICONDUCTOR

(75) Inventors: Anton Mauder, Kolbermoor (DE); Hans-Joachim Schulze, Ottobrunn (DE)

(73) Assignee: Infineon Technologies Austria AG, Villach (AT)

(*) Notice: Subject to any disclaimer, the term of this patent is extended or adjusted under 35 U.S.C. 154(b) by 467 days.

(21) Appl. No.: 11/831,362

(22) Filed: Jul. 31, 2007

(65) Prior Publication Data

US 2008/0023801 A1 Jan. 31, 2008

(30) Foreign Application Priority Data

Jul. 31, 2006 (DE) ............... 10 2006 035 630

(51) Int. Cl.
*H01L 21/336* (2006.01)
(52) U.S. Cl. ............... 438/308; 438/10; 257/E21.328
(58) Field of Classification Search ............... 438/10, 438/308; 257/E21.328
See application file for complete search history.

(56) References Cited

U.S. PATENT DOCUMENTS

| 3,314,833 | A | * | 4/1967 | Arndt et al. ............... 438/548 |
| 5,182,626 | A | * | 1/1993 | Akiyama et al. ............ 257/142 |
| 6,723,586 | B1 | * | 4/2004 | Niedernostheide et al. .. 438/133 |
| 2001/0030331 | A1 | * | 10/2001 | Minato ............... 257/138 |
| 2002/0001925 | A1 | * | 1/2002 | Sakamoto et al. ........... 438/508 |

FOREIGN PATENT DOCUMENTS

| DE | 19711438 | 9/1998 |
| DE | 10 2004 039 208 | 2/2006 |
| JP | 04125933 | 4/1992 |
| JP | 05102161 | 4/1993 |

* cited by examiner

*Primary Examiner*—Thao X Le
*Assistant Examiner*—Ajay K Arora
(74) *Attorney, Agent, or Firm*—Dicke, Billig & Czaja, PLLC

(57) ABSTRACT

A method for producing an integrated circuit including a semiconductor is disclosed. In one embodiment, crystal defects are produced by irradiation in the material of the underlying semiconductor substrate which crystal defects form an inhomogeneous crystal defect density distribution in the vertical direction of the semiconductor component and lead to a corresponding inhomogeneous distribution of the carrier lifetime.

26 Claims, 8 Drawing Sheets

H 3.75 MeV, 7° in 120 μm thick Si,
TRIM with full damage
~0.3% of the ions stop in the Si,
99.7% transmission
projected range at this
energy in Si: approximately 133 μm H 3.6 MeV, 7° in 120 μm thick Si,
TRIM with full damage
~2.5% of the ions stop in the Si,
97.5% transmission
projected range at this
energy in Si: approximately 124 μm H 3.6 MeV, 7° in 240 μm thick Si,
(illustration only 120 μm)
TRIM with full damage
negligibly more damage
(presumably back scattering of ions)
projected range at this
energy in Si: approximately 124 μm He 15 MeV, 7° in 120 μm thick Si,
TRIM with full damage
~1% of the ions stop in the Si,
99% transmission
projected range at this
energy in Si: approximately 134 μm — proton implantation
--- helium implantation

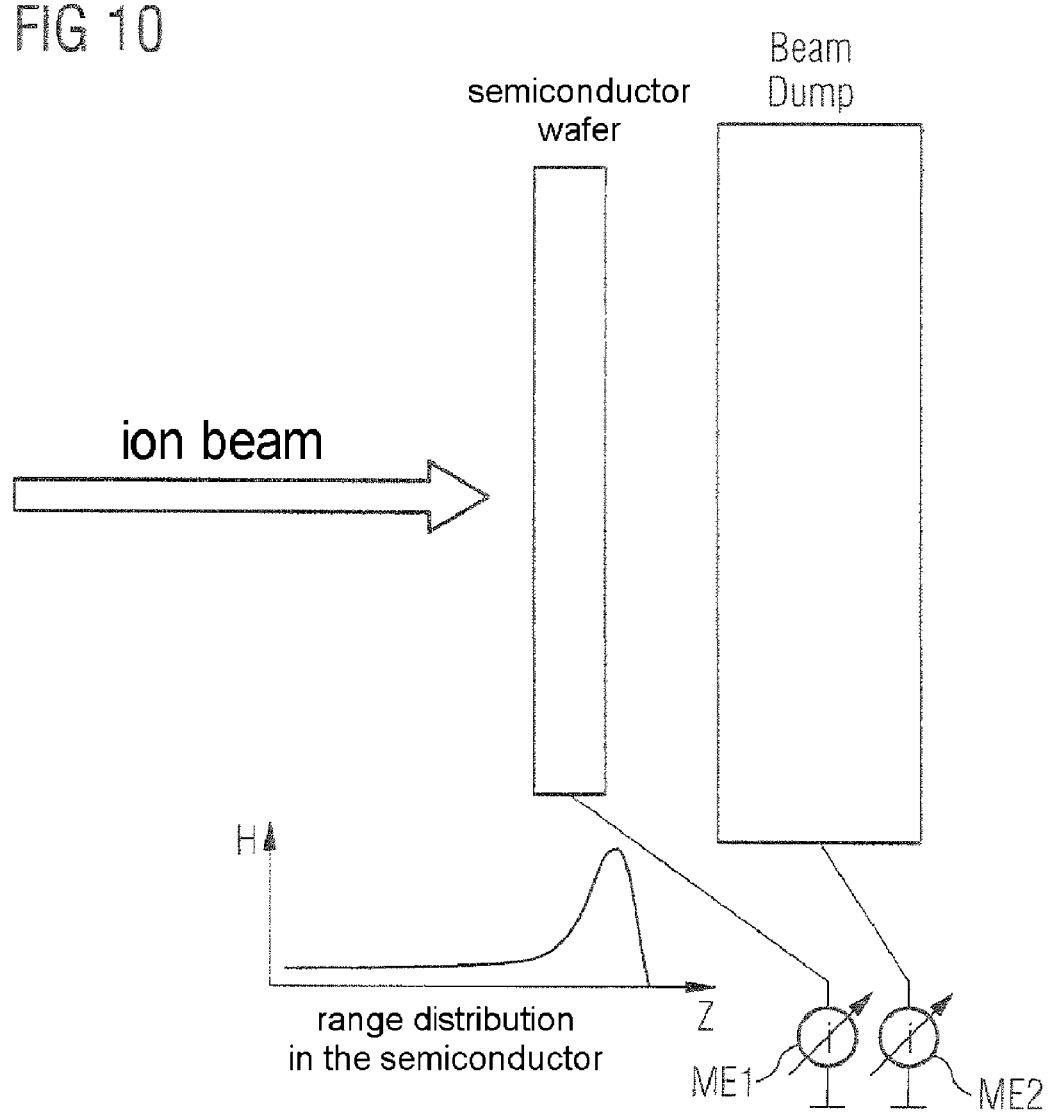

METHOD FOR PRODUCING AN INTEGRATED CIRCUIT INCLUDING A SEMICONDUCTOR

CROSS-REFERENCE TO RELATED APPLICATIONS

This Utility Patent Application claims priority to German Patent Application No. DE 10 2006 035 630.6 filed on Jul. 31, 2006, which is incorporated herein by reference.

BACKGROUND

The present invention relates to a method for producing an integrated circuit including a semiconductor. In one embodiment, the method includes realizing an inhomogeneous charge carrier lifetime distribution in the semiconductor.

In the further development of modern semiconductor components there are often requirements to the effect that different classes of components having different specific properties are to be formed. This involves e.g., the turn-on or turn-off behavior, the position of specific breakdown regions and the like. In order to be able to form specific properties in specific semiconductor component classes, it may be necessary to form on the one hand the dopant distribution and on the other hand specific charge carrier lifetime distributions in the semiconductor substrate underlying the component.

The targeted configuration of the carrier lifetime distribution in the semiconductor substrate is problematic in this case.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 10 illustrates a measuring arrangement in a schematic form.

DETAILED DESCRIPTION

Figure 1B:
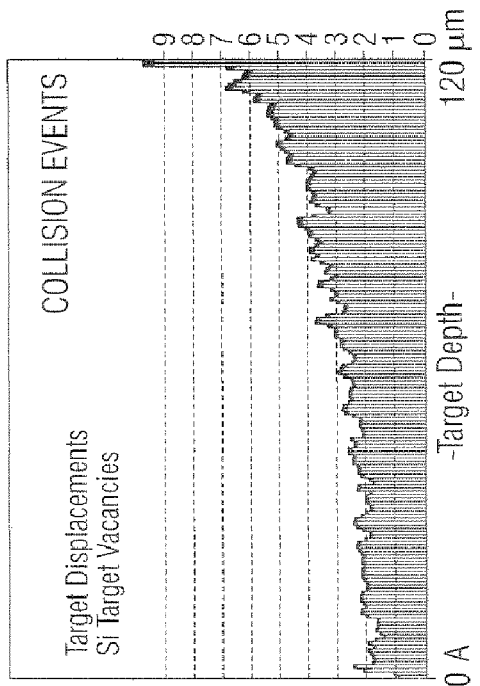
FIGS. 1A-4C illustrate, in the form of graphs, the irradiation results for different preparation conditions, in each case in depth-dependent form.
Figure 1C:
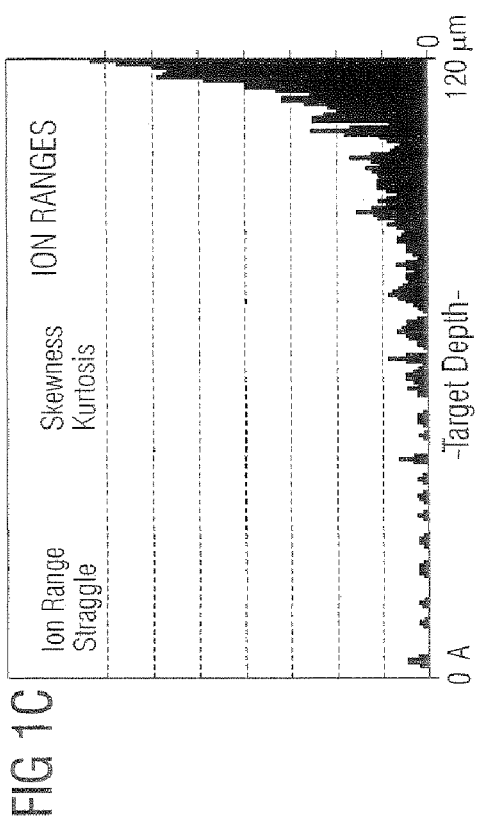
Figure 1A:
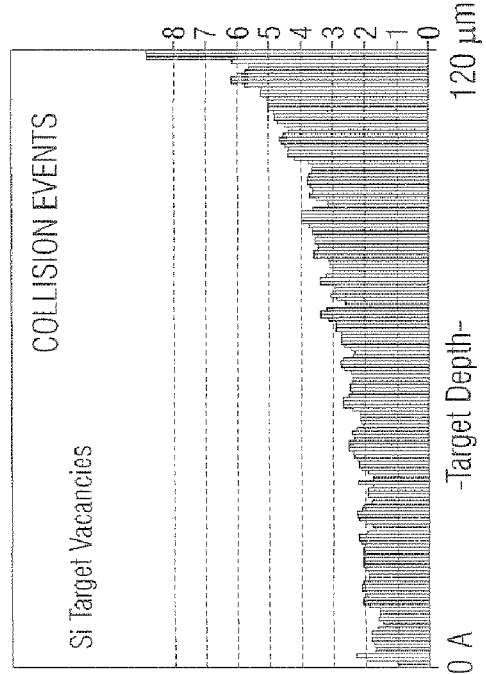
Figure 2A:
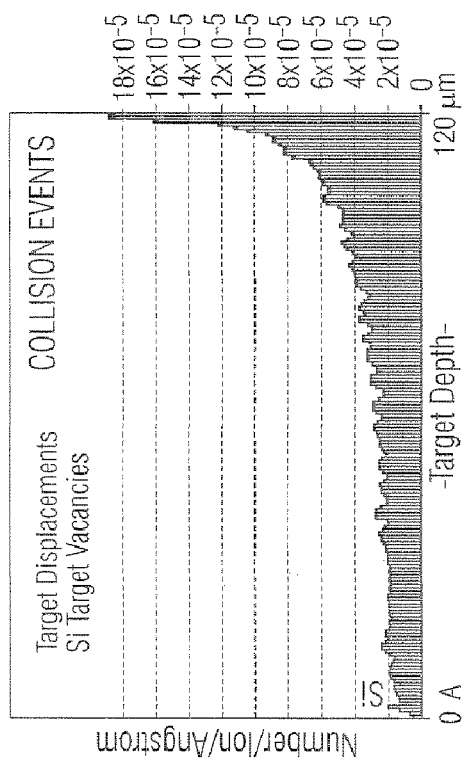
Figure 2B:
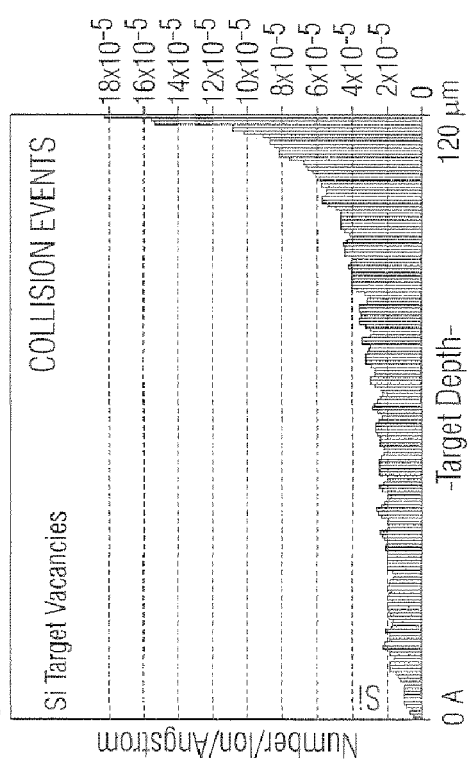
Figure 2C:
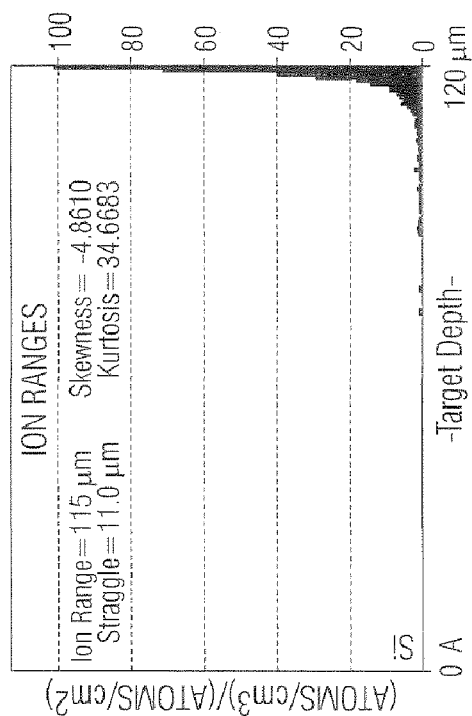
Figure 3B:
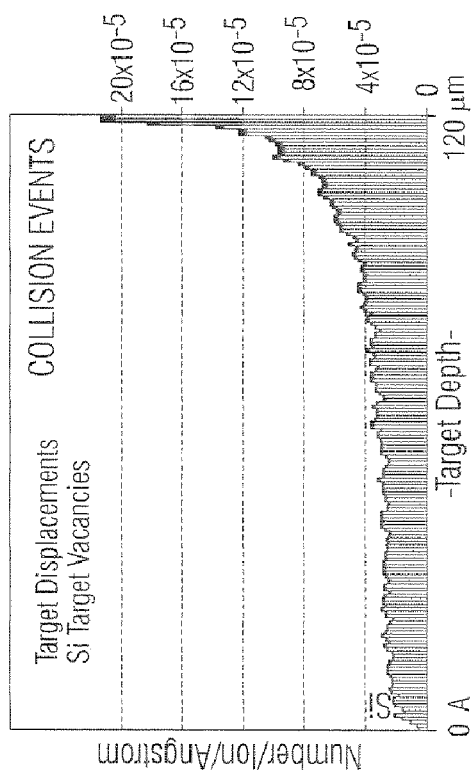
Figure 3C:
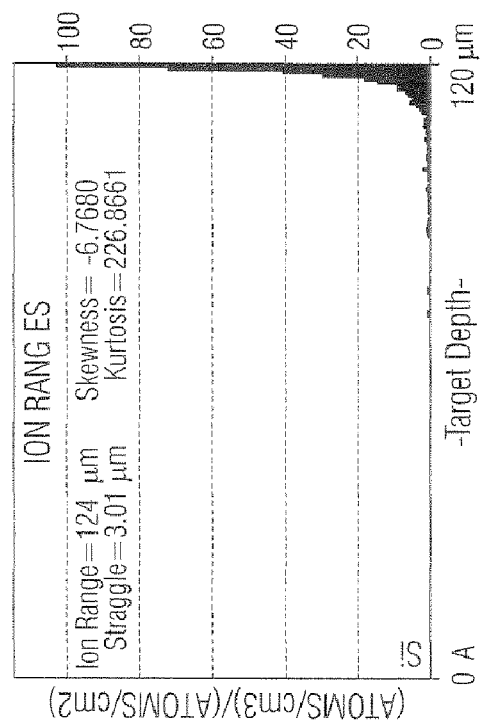
Figure 3A:
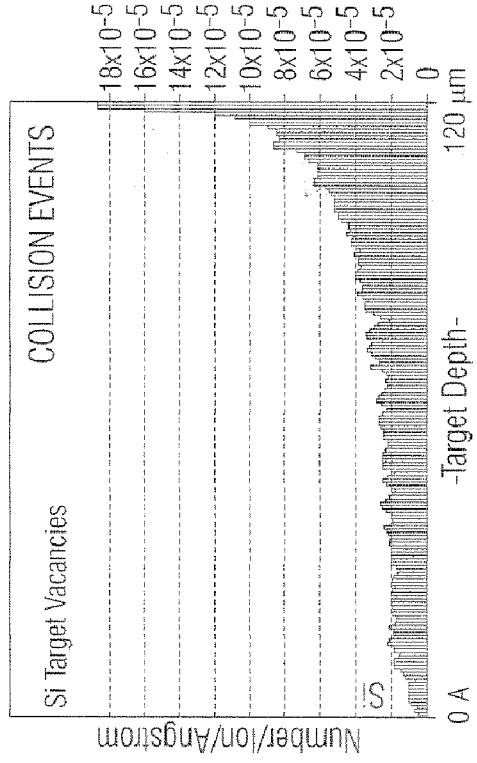
Figure 4B:
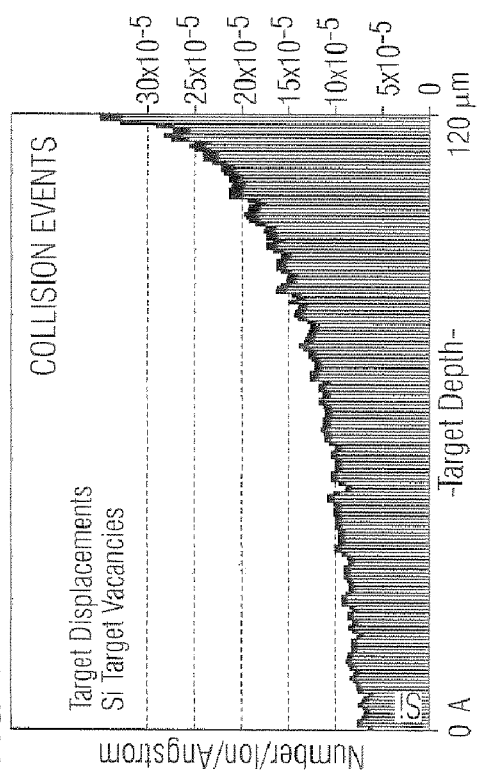
Figure 4C:
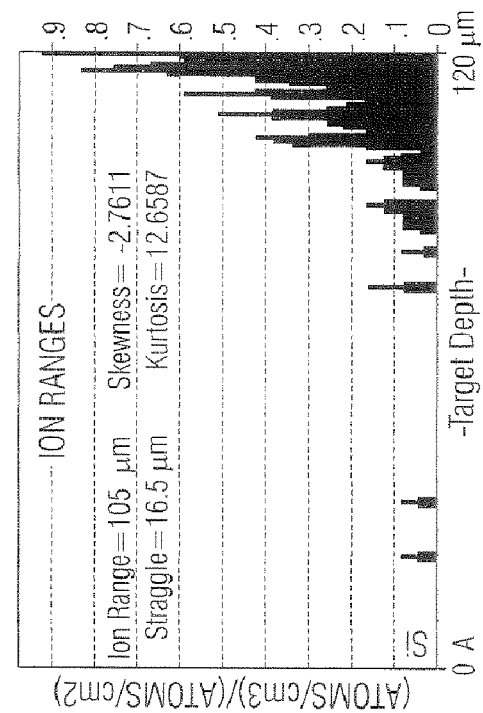
Figure 4A:
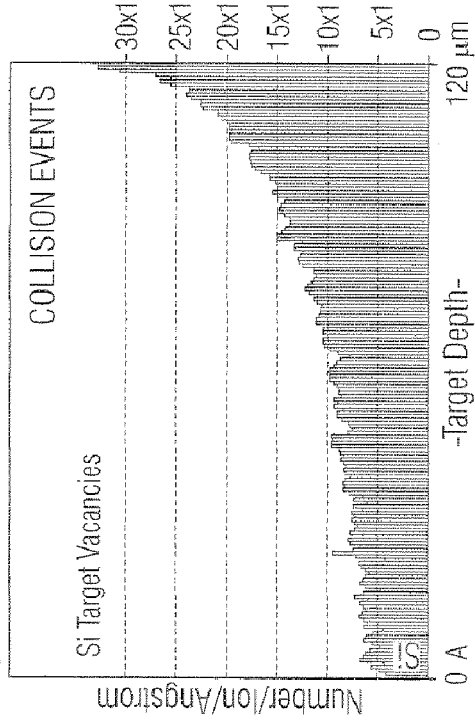

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Structurally and/or functionally similar or comparable elements are designated by the same reference symbols below, without a detailed description being repeated whenever they occur.

One or more embodiments provide a method for producing an integrated circuit including a semiconductor in which the carrier lifetime distribution in the underlying semiconductor substrate can be formed suitably in a simple and well-defined manner.

One or more embodiments bring about crystal defects in the semiconductor substrate underlying the semiconductor component by irradiation in such a way that the crystal defects are present in the material of the underlying semiconductor substrate with an inhomogeneous distribution and an inhomogeneous distribution of the carrier lifetime is correspondingly established on account of the crystal defects functioning as condensation nuclei.

One embodiment provides a method for producing a semiconductor component in which in an underlying semiconductor substrate having a front side and having a rear side, crystal defects are produced by irradiation via the front side or via the rear side as entrance surface for the radiation in the material of the semiconductor substrate, wherein—measured from the front side to the rear side of the semiconductor substrate—an inhomogeneous crystal defect density is produced in such a way that—measured from the front side to the rear side of the semiconductor substrate—a corresponding inhomogeneous distribution of the carrier lifetime is established by way of the crystal defects as condensation nuclei.

A particle radiation can be used for the irradiation.
A proton radiation can be used for the irradiation.
A helium radiation can be used for the irradiation.
Radiations from other non-doping elements—such as e.g., noble gases or semiconductor atoms—can be used for the irradiation.

The front side of the semiconductor substrate can be used as entrance surface for the radiation.

In one embodiment, the rear side of the semiconductor substrate can also be used as entrance surface for the radiation.

A radiation can be used whose average penetration depth—in one embodiment through the choice of the energy of the radiation—in the material of the semiconductor substrate exceeds, in one embodiment by at most 10%, the layer thickness of the semiconductor substrate, measured from the front side to the rear side.

A radiation can be used whose projected range—in one embodiment through the choice of the energy of the radiation—in the material of the semiconductor substrate exceeds, in one embodiment by at most 10%, the layer thickness of the semiconductor substrate, measured from the front side to the rear side.

A radiation can be used which—in one embodiment through the choice of the energy of the radiation—partly emerges again from the material of the semiconductor substrate.

That proportion of the radiation which emerges again from the material of the semiconductor substrate can amount to 50% or more.

That proportion of the radiation which emerges again from the material of the semiconductor substrate can also amount to 90% or more.

That proportion of the radiation which emerges again from the material of the semiconductor substrate can, however, also amount to 97.5% or more.

It is also conceivable for that proportion of the radiation which emerges again from the material of the semiconductor substrate to amount to 99% or more.

Preferably, all doping regions of the semiconductor component are formed prior to the irradiation.

Furthermore, any thermal processes, in one embodiment above a temperature of 700° C., can be carried out prior to the irradiation.

A heat treatment process can be carried out after the irradiation.

The heat treatment process can be carried out at a temperature which lies above the operating temperature of the component to be formed and/or which lies within the range of approximately 220° C. to approximately 340° C.

The irradiation can be combined with an electron irradiation and/or with a heavy metal diffusion of gold and/or platinum.

In addition or as an alternative and/or platinum and/or gold can be indiffused prior to the irradiation and be redistributed by a or a further heat treatment process after the irradiation.

The average penetration depth, the projected range and/or the energy of the radiation for a given underlying semiconductor substrate can be related to one another and determined by a closed functional relationship or by a closed mathematical expression, preferably by a quadratic equation, furthermore preferably in accordance with a relationship (1):

$$y = a \cdot x^2 + b \cdot x + c \quad (1)$$

where y denotes the range, in one embodiment measured in μm, x denotes the implantation energy, in one embodiment measured in MeV, and a, b, c denote parameters, and where the latter assume values in accordance with (2)

$$a=5.7542, b=14.13 \text{ and } c=1.2711 \quad (2)$$

for protons and values in accordance with (3)

$$a=0.4289, b=2.6626 \text{ and } c=0.3385 \quad (3)$$

for helium.

The average penetration depth, the projected range and/or the energy of the radiation for a given underlying semiconductor substrate can be related to one another and determined by using a table look-up method.

A bipolar component, a diode, an IGBT, a GTO, a thyristor or a transistor can be produced.

In one embodiment, a heat treatment process can be carried out at a temperature of between approximately 220° C. and approximately 900° C.

In one embodiment, a heat treatment process can be carried out for a time period of between approximately 10 seconds and approximately 10 hours.

In one embodiment, a lateral variation of the distribution of the carrier lifetime can be additionally formed in the semiconductor substrate.

The additional lateral variation of the distribution of the carrier lifetime can be formed by using screens.

The additional lateral variation of the distribution of the carrier lifetime can be formed in one embodiment by using metal screens.

In one embodiment, the method according to the invention, the proportion of the ion current from the implantation process which is absorbed in the semiconductor substrate is measured by using a first measuring device, the proportion of the ion current from the implantation process which is transmitted through the semiconductor substrate is measured by using a second measuring device, and the implantation energy is set and adapted to the vertical thickness of the semiconductor substrate by using a determination and evaluation of the ratio of the transmitted proportion of the ion current from the implantation process to the absorbed proportion of the ion current from the implantation process.

One or more embodiments are furthermore explained in detail on the basis of the observations below:

One embodiment provides methods for realizing an inhomogeneous carrier lifetime distribution.

In semiconductor components it is often desired to set an inhomogeneous distribution of the charge carrier lifetime in the vertical direction of the components in order e.g., to increase the softness during turn-off of the components or else to reduce the turn-off losses for a predetermined forward voltage. In the case of diodes, in one embodiment, a carrier lifetime profile is desirable which has a minimum of the carrier lifetime in the region of the pn junction and an increasing carrier lifetime in the direction of the n-type emitter located on the other side of the silicon wafer.

Combinations of a proton or helium irradiation with an electron irradiation have been used hitherto for producing similar profile forms. However, the use of two different irradiation sources is relatively complicated. A further disadvantage arises from the fact that the region damaged by electron irradiation always brings about a carrier lifetime reduction that is homogeneous in the vertical direction, such that a continuous vertical variation of the carrier lifetime is not possible.

It is proposed to use a proton irradiation for the realization of a carrier lifetime profile in which the carrier lifetime continuously increases or decreases in the vertical direction of the component, the energy preferably being chosen in such a way that at least part, preferably the major part, of the protons emerge again on the other side of the wafer. A further boundary condition for the function of the principle proposed consists in the fact that the "end of range" of the proton irradiation in the semiconductor material is, however, also not much greater than the thickness of the semiconductor wafer to be irradiated.

Protons require the least acceleration energy to achieve a desired depth in the semiconductor. The necessary acceleration energies for protons and, if appropriate, for helium ions are technically easier to realize than for heavier particles, for which reason these two irradiation species are preferred here.

In this case, it is unimportant whether the implantation is effected into a thick wafer that is subsequently thinned to the target level, or whether the ions, after radiating through the thin semiconductor sample, pass into the open and are captured e.g., in a beam dump.

This is because this measure produces a defect density distribution in the vertical direction which leads to the desired vertical distribution of the carrier lifetime.

In order to illustrate this, FIGS. 1 to 4 illustrate the distributions—calculated by the program "TRIM"—of the vacancies for various implantation conditions.

Since the recombination centers produced by irradiation are always correlated with vacancies (such as e.g., the double vacancies or the vacancy-oxygen complex), this calculated distribution also reflects the vertical profile of the carrier lifetime. A further advantage in radiating through the semiconductor wafer consists in the fact that the production of proton-induced donors which might influence the blocking behavior of the semiconductor component is largely avoided or significantly reduced.

In principle, heavier, non-doping elements are also suitable for the irradiation. In the case of the elements, the damage distribution becomes more inhomogeneous, that is to say that the ratio of the damage in the "end of range" to the region through which radiation is transmitted is significantly higher. Since the ranges of heavier elements in the semiconductor also decrease drastically, virtually only helium is suitable for this purpose; in this respect, also see FIG. 4.

In this embodiment, the intensity of the carrier lifetime reduction can be controlled by way of the choice of the proton dose. In one embodiment, for stabilizing the carrier lifetime reduction, a suitable heat treatment is carried out at temperatures lying within the range of between 220° C. and 340° C. after the irradiation. This relatively low heat treatment temperature also has the effect of avoiding the formation of too many proton-induced donors.

If required, the "end of range" can also be positioned within the semiconductor wafer, thus resulting in a carrier lifetime sink followed by a continuous rise in the carrier lifetime in the irradiation direction. In this embodiment including a diode, the irradiation would have to be carried out from the side on which the n-type emitter of the diode is situated.

One embodiment consists in setting a vertically inhomogeneous carrier lifetime by irradiating the wafers with protons, the penetration depth of the protons in homogeneous semiconductor material being slightly greater than the wafer thickness.

The figures illustrate the radiation damage—"target displacements" or "Si target vacancies"—and also the range of the ions for different implantation conditions. A typical 1200V material was chosen as wafer thickness. For higher or lower blocking capabilities, the wafer thickness (rule of thumb thickness in μm=nominal reverse voltage in V divided by 10) and also the implantation energy are to be adapted accordingly.

In one embodiment, exclusively the irradiation is used as lifetime setting. Optionally, the irradiation can also be combined with an electron irradiation or even better with a platinum diffusion.

By providing additional lattice vacancies, it is possible to incorporate more platinum atoms on lattice sites than would correspond to the diffusion temperature, or it is possible to set the same inhomogeneous Pt profile as would correspond to the vacancy distribution.

A prediffusion of Pt is carried out in which significantly more Pt is introduced in an electrically inactive fashion on interstitial sites than is situated in an electrically active fashion on lattice sites. The described implantation for producing the crystal defects is followed by an (if appropriate only short) high-temperature process in which the lattice vacancies are occupied by Pt.

Instead of platinum it is also possible to use gold, although the latter leads to a higher leakage current level of the component.

One embodiment of this variant provides for an impairment of oxides and of the interfaces with the semiconductor is avoided by using the high-temperature process. The adverse influence (which otherwise often occurs) of irradiations on leakage currents, threshold voltages, reverse voltages of chips can thus be avoided.

Another advantage consists in the fact that targeted vertical variation of the heavy metal concentration, on account of the described decoration of crystal defects with heavy metal atoms, produces a vertically inhomogeneous carrier lifetime profile which is significantly more thermostable than the defect profiles produced by using an irradiation.

A further possibility for use of this variant is a "short thin-wafer process" in the case of freewheeling diodes if the switching properties of diodes are to be matched to those of the present-day diodes by using the new, short process. In the case of present-day freewheeling diodes with a cathode emitter set in a targeted manner, the platinum diffusion often takes place with wafers that have already been thinned to their small final thickness, whereby a higher platinum concentration than in the bulk material results on the rear side of the wafer on account of the "bathtub profile" in the platinum incorporation. If—as in the case of the short thin-wafer process—the platinum diffusion is carried out with thick wafers, the increased platinum concentration and, consequently, the more intense carrier lifetime reduction before the rear-side emitter are absent.

Figure 6:
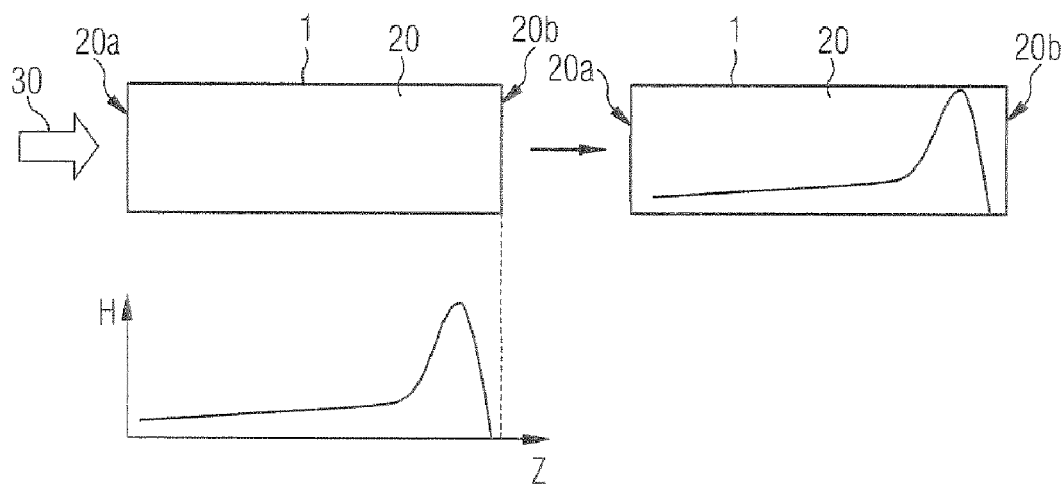
FIGS. 6-8 illustrate, in schematic and sectional side view, an integrated circuit including semiconductor structures which are formed with different inhomogeneous carrier lifetime distributions.
Figure 7:
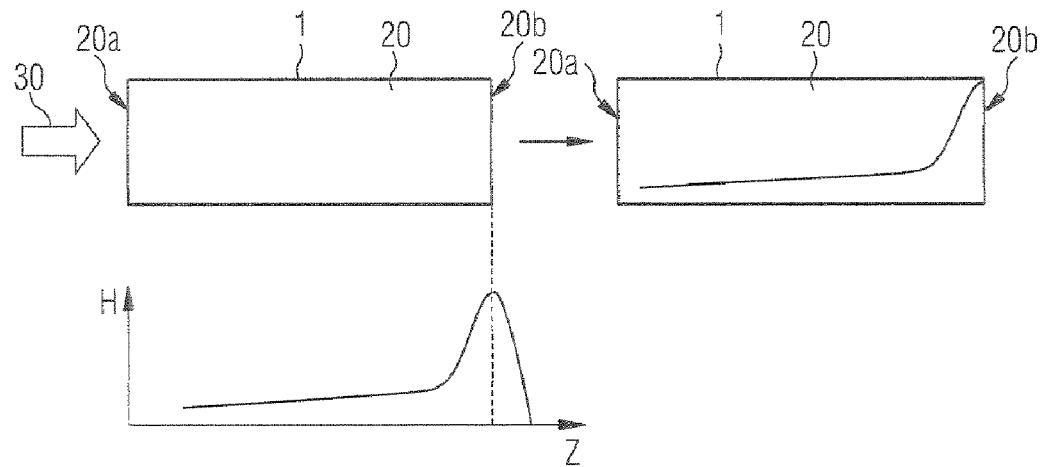
Figure 8:
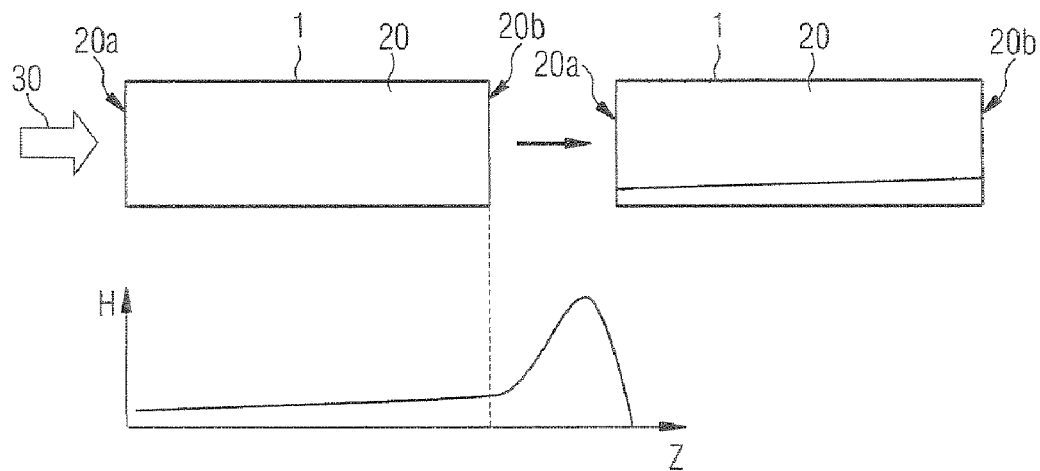

FIGS. 6, 7 and 8 illustrate, in schematic and sectional side view, how, in a semiconductor substrate 20 for a semiconductor component 1 to be formed, an inhomogeneous dense distribution of crystal defects and consequently upon the completion of the semiconductor component 1 an inhomogeneous distribution of the charge carrier lifetime can be achieved by irradiation.

A semiconductor substrate 20 for a semiconductor component 1 is illustrated on the right-hand side in FIG. 6. The semiconductor substrate 20 has a top side 20a and an underside 20b. The top side 20a of the semiconductor substrate 20 is used as entrance surface for the radiation 30 to be applied. The graph illustrates the frequency H of the radiation-induced crystal defects as a function of the depth Z in the semiconductor substrate 20, in each case measured from the top side 20a of the semiconductor substrate 20 toward the underside 20b. A weakly yet continuously rising phase initially results on the left-hand side of the graph, which phase then rapidly culminates toward the right-hand side of the graph in a maximum before rapidly falling toward zero.

In the embodiment in FIG. 6, the properties of the radiation 30, in one embodiment the energy thereof, are chosen such that the entire radiation is practically absorbed in the material of the semiconductor substrate 20.

In the transition to the state illustrated on the right-hand side of FIG. 6 for the semiconductor substrate 20, a distribution of the crystal defects in the material of the semiconductor substrate 20 that corresponds to the frequency distribution H (Z) of the graphical diagram on the left-hand side of FIG. 6 then results. This means that, from the top side 20a toward the underside 20b, a weakly yet continuously rising distribution is initially present, which then undergoes transition to a distribution maximum with a rapid fall, such that an inhomogeneous crystal defect density distribution and consequently upon completion of the semiconductor component 1 an inhomogeneous charge carrier lifetime distribution result overall.

In the case of the situation illustrated in FIG. 7, the properties, in one embodiment the energy, of the radiation 30 are chosen such that a specific proportion of the radiation emerges again from the material of the semiconductor substrate 20 on the underside 20b, so that after the weakly yet continuously rising region of the frequency distribution H (Z) the adjacent maximum no longer lies in the region of the semiconductor substrate 20.

The distribution of the crystal defects in the semiconductor substrate 20 is correspondingly then also established in the manner illustrated on the right-hand side of FIG. 7, namely in such a way that the weakly yet continuously rising region is followed by a sharp rise which then determines overall the inhomogeneous distribution in the semiconductor substrate 20.

In the embodiment described in FIG. 8, the parameters of the radiation 30 are set in such a way that a major part of the total radiation emerges again at the underside 20b of the semiconductor substrate 20.

In one embodiment, almost exclusively the weakly yet continuously rising region of the frequency distribution H (Z) is present in the region of the semiconductor substrate 20, such that a weakly yet continuously rising distribution of the crystal defects and a corresponding weakly yet continuously decreasing distribution of the carrier lifetime in the semiconductor substrate 20 are consequently established, as is illustrated on the right-hand side of FIG. 8.

FIGS. 1A to 4C illustrate various findings determined by a simulation which reflect the basic concepts illustrated in connection with FIGS. 6 to 8 in a practical regard. The illustrations in FIGS. 1A to 4C have already been explained in detail above.

Figure 5:
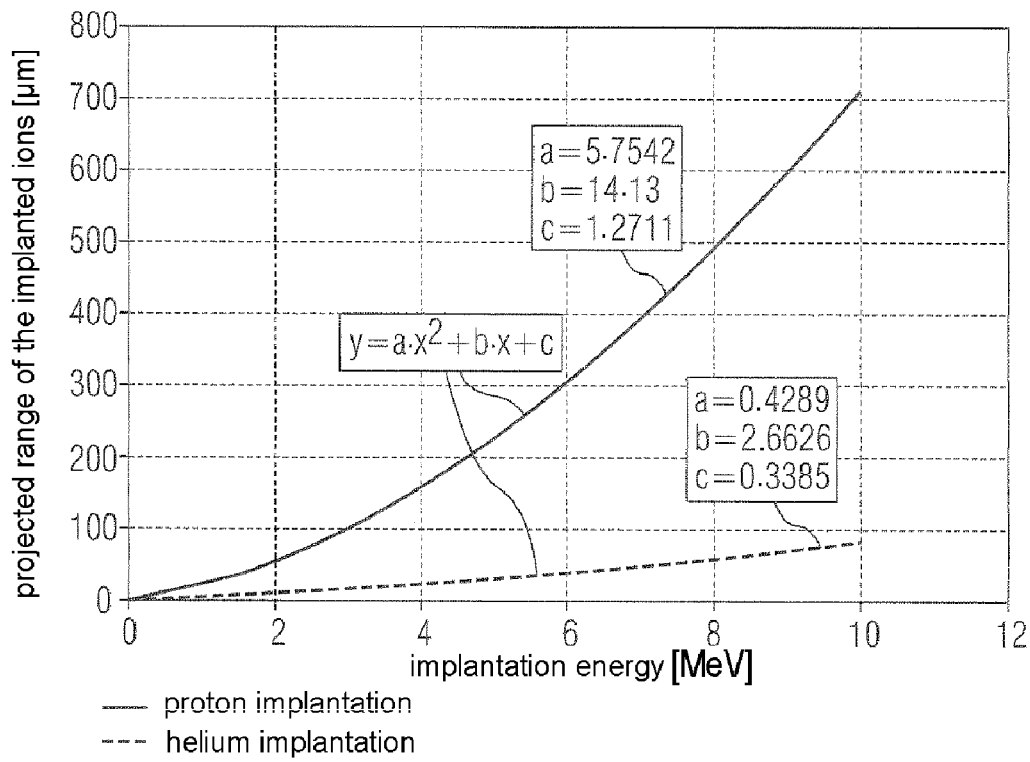
FIG. 5 illustrates, in the form of a graph, the projected range for protons and helium ions as a function of the implantation or irradiation energy used.

FIG. 5 illustrates a graph which establishes a relationship between the energy or implantation energy used in the case of proton radiation or helium radiation used and the respectively resulting projected range of the implanted ions. In principle, the illustration in FIG. 5 can be used to find that energy which has to be applied for a desired projected range during a proton irradiation or during a helium irradiation. This may exist in analytical form, e.g., by using the respectively specified formulae in the sense of a functional relationship between the projected range and the implantation energy, or a table lookup method can also take place, e.g., even in the case of more complicated relationships that cannot be represented in closed fashion.

Another advantage of the method described consists in the fact that a lateral variation of the carrier lifetime is also possible using relatively simple means, to be precise e.g., by application of relatively thin metal screens. For masking electron irradiation, by contrast, comparatively thick screens in the range of a few mm to a few cm are required which are not able, or are able only with difficulty, to be manufactured with the required precision and be aligned with the irradiated semiconductor wafer. Moreover, bremsstrahlung arises in these thick screens and leads to a reduction of the carrier lifetime in the masked region as well.

In the case of electron irradiations, energies with particle energy of more than 270 keV, preferably more than 500 keV, are required in order to produce instances of crystal damage in silicon that act as recombination centers and thus reduce the charge carrier lifetime. At such high energies electrons largely radiate through the semiconductor crystal, such that the recombination effect occurs practically homogeneously in the crystal.

In the case of indiffusion of heavy metal atoms such as e.g., gold or platinum, the recombination effect is likewise very homogeneous over the entire semiconductor volume with a slight increase in the direction of the semiconductor surfaces. The incorporated concentration and hence the recombination effect of the metal atoms is temperature-dependent. In order to obtain a sufficient electrical effectiveness, high diffusion temperatures above approximately 700° C. are required at which the heavy metal atoms diffuse far even during short diffusion times.

The implantation of non-doping atoms such as e.g., helium, argon, silicon or hydrogen for producing instances of crystal damage which then act as recombination centers is known. However, the implantation energy has hitherto always been chosen in such a way that the implanted ions remain practically completely in the semiconductor.

Figure 9A:
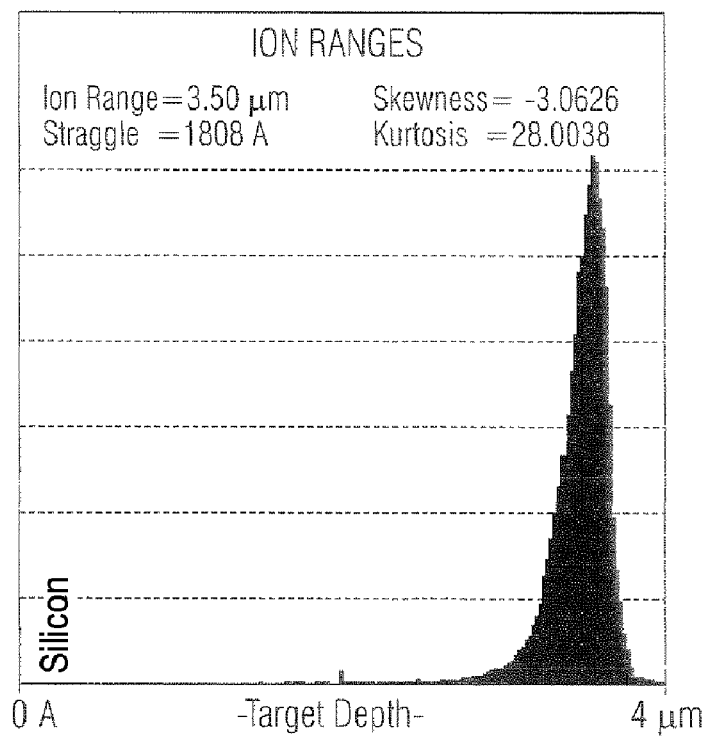
FIGS. 9A, B illustrate, in the form of graphs, the irradiation results for other preparation conditions, in each case in depth-dependent form.
Figure 9B:
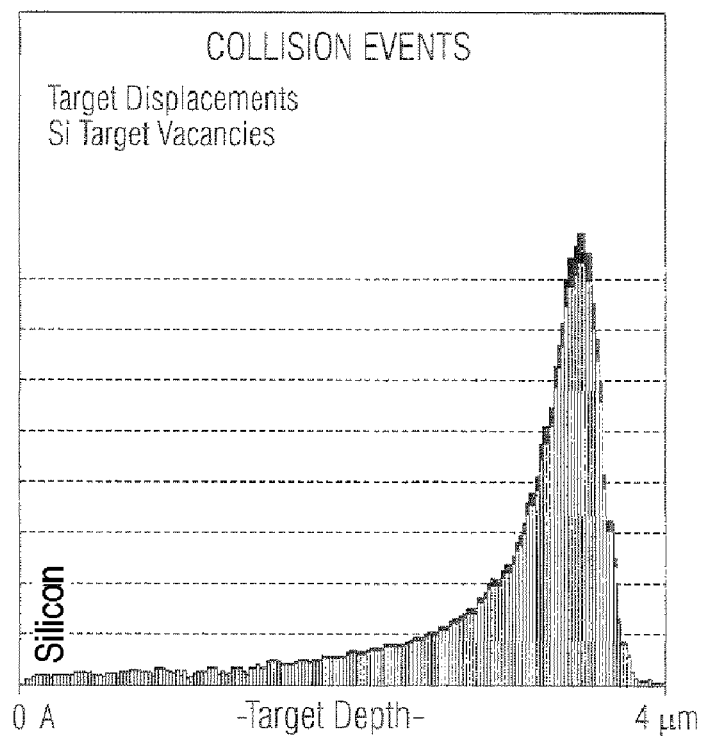

The example in FIGS. 9A and 9B illustrates the range distribution of an implantation of helium in silicon with an energy of 1.0 MeV at an angle of incidence of 0° on the left and the associated distribution on the right.

The instances of crystal damage in the region through which radiation is transmitted amount to between approximately 2% and 10% of the damage from the region in which the predominant number of ions stops, the "end of range". This type of implantations is therefore used only for locally greatly reducing the carrier lifetime, in which case customary carrier lifetimes in the end of range are less than 0.1 µs, mainly even less than 0.01 µs, while the carrier lifetime in the volume of bipolar components is usually greater than 0.1 µs.

The local reduction of the carrier lifetime is often combined with homogeneous methods of charge carrier lifetime setting.

Such extreme reductions of the carrier lifetimes are often used for reduction and targeted setting of the emitter effect. Conversely, intensive carrier lifetime reduction also requires correspondingly strong emitters that are not always desirable and, for its part, causes additional variations in the emitter efficiency.

The described method according to the invention makes it possible for the first time to obtain over the entire active semiconductor volume or large parts thereof an inhomogeneous charge carrier lifetime without local regions having extremely short carrier lifetimes.

One difficulty in the production method for locally inhomogeneous charge carrier lifetime setting by using deep ion implantation is presented by the task of balancing the penetration depth and hence the implantation energy with the precise thickness of the component. When thinning components there is very rapidly a tolerance in the range of a few µm (e.g., +/−5 µm). By contrast, the implantation energy is set highly precisely and has the effect that the implantation peak can fluctuate significantly relative to the rear side of the component. Since the density of the implanted atoms and the instances of crystal damage increase greatly in the vicinity of the implantation peak, this uncertainty can lead to severe fluctuations in the component properties.

In further embodiments, the implantation for setting the charge carrier lifetime is carried out when the semiconductor wafer with the individual components has already been thinned to the final thickness of the components.

In the ion implanter, both the semiconductor wafer and a beam dump which lies behind the latter and in which the ions transmitted through the semiconductor wafer are captured are then provided with a current measuring device (see FIG. 10).

By using the ratio of the current intensities from the semiconductor wafer and the beam dump it is possible to determine the range distribution in the semiconductor wafer and if necessary to readjust the implantation energy, such that it is possible to precisely define the position of the implantation peak with respect to the rear side.

The same analogously holds true for the case where the implantation peak is intended to lie in the vicinity of the front side of the wafer and implantation is effected through the rear side.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit including a semiconductor, comprising:
   providing an underlying semiconductor substrate having a front side and a rear side;
   producing crystal defects by irradiation via the front side or via the rear side as entrance surface for the radiation in a material of the semiconductor substrate, including producing an inhomogeneous crystal defect density measured from the front side to the rear side of the semiconductor substrate, and establishing a corresponding inhomogeneous distribution of the carrier lifetime by way of the crystal defects as condensation nuclei, measured from the front side to the rear side of the semiconduct substrate;
   measuring a proportion of the ion current from the implantation process which is absorbed in the semiconductor substrate by using a first measuring device;
   measuring a proportion of the ion current from the implantation process which is transmitted through the semiconductor substrate by using a second measuring device; and
   setting and adapting the implantation energy to a vertical thickness of the semiconductor substrate by using a determination and evaluating the ratio of a transmitted proportion of the ion current from the implantation process to an absorbed proportion of the ion current from the implantation process.

2. The method of claim 1, comprising using a particle radiation for the irradiation.

3. The method of claim 1, comprising using a proton radiation for the irradiation.

4. The method of claim 1, comprising using a helium radiation for the irradiation.

5. The method of claim 1, comprising using the front side of the semiconductor substrate as entrance surface for the radiation.

6. The method of claim 1, comprising using the rear side of the semiconductor substrate as entrance surface for the radiation.

7. The method of claim 1, comprising using a radiation whose average penetration depth through the choice of the energy of the radiation in the material of the semiconductor substrate exceeds, by at most 10%, the layer thickness of the semiconductor substrate, measured from the front side to the rear side.

8. The method of claim 1, comprising using a radiation whose projected range in the material of the semiconductor substrate exceeds by at most 10%, the layer thickness of the semiconductor substrate, measured from the front side to the rear side.

9. The method of claim 1, comprising using a radiation which through the choice of the energy of the radiation partly emerges again from the material of the semiconductor substrate.

10. The method of claim 1, comprising wherein that proportion of the radiation which emerges again from the material of the semiconductor substrate amounts to 50% or more.

11. The method of claim 1, comprising wherein that proportion of the radiation which emerges again from the material of the semiconductor substrate amounts to 90% or more.

12. The method of claim 1, comprising wherein that proportion of the radiation which emerges again from the material of the semiconductor substrate amounts to 97.5% or more.

13. The method of claim 1, comprising wherein that proportion of the radiation which emerges again from the material of the semiconductor substrate amounts to 99% or more.

14. The method of claim 1, comprising forming all doping regions of the semiconductor component prior to the irradiation.

15. The method of claim 1, comprising carrying out any thermal processes, in particular above a temperature of 700° C., out prior to the irradiation.

16. The method of claim 1, comprising carrying out a heat treatment process after the irradiation.

17. The method of claim 16, comprising carrying out the heat treatment process out at a temperature which lies above the operating temperature of the component to be formed and/or which lies within the range of approximately 220° C. to approximately 340° C.

18. The method of claim 1, comprising:
   combining the irradiation with an electron irradiation and/or with a platinum diffusion; and
   indiffusing platinum and/or gold prior to the irradiation and distributing by a heat treatment process after the irradiation.

19. The method of claim 1, comprising wherein an average penetration depth, a projected range and/or energy of the radiation for a given underlying semiconductor substrate are related to one another and determined by a closed functional relationship:

$$y = a \cdot x^2 + b \cdot x + c$$

where y denotes the range, in particular measured in µm, x denotes the implantation energy, in particular measured in MeV, and a, b, c denote parameters, and where the latter assume values in accordance with a=5.7542, b=14.13 and c=1.2711 for protons and values in accordance with (3)

a=0.4289, b=2.6626 and c=0.3385        (3)

for helium.

20. The method of claim 1, comprising wherein an average penetration depth, a projected range and/or energy of the radiation for a given underlying semiconductor substrate are related to one another and determined by using a table look-up method.

21. The method of claim 1, comprising producing a bipolar component, a diode, an IGBT, a GTO, a thyristor or a transistor.

22. The method of claim 1, comprising carrying out an additional heat treatment process at a temperature of between approximately 220° C. and approximately 900° C.

23. The method of claim 1, comprising carrying out an additional heat treatment process for a time period of between approximately 10 seconds and approximately 10 hours.

24. The method of claim 1, comprising additionally forming a lateral variation of the distribution of the carrier lifetime in the semiconductor substrate.

25. The method of claim 24, comprising forming the additional lateral variation of the distribution of the carrier lifetime by using screens.

26. The method of claim 1, comprising forming the additional lateral variation of the distribution of the carrier lifetime by using metal screens.

* * * * *